United States Patent [19]

Cheng

[11] Patent Number: 5,654,712

[45] Date of Patent: Aug. 5, 1997

[54] ENCODING CONTROL DEVICE

[75] Inventor: Andrew Cheng, Hsinchu, Taiwan

[73] Assignee: Holtek Microelectronics Inc., Isinchu, Taiwan

[21] Appl. No.: 510,388

[22] Filed: Aug. 2, 1995

[51] Int. Cl.[6] ............................................. H03M 1/10
[52] U.S. Cl. ............................................. 341/155
[58] Field of Search ................................. 341/155, 144, 341/154, 136, 153, 133, 159

[56] References Cited

U.S. PATENT DOCUMENTS 4,027,306  5/1977  Hackmeister ...................... 341/26
4,804,940  2/1989  Takigawa et al. .................. 341/133
5,534,862  7/1996  Gross et al. ....................... 341/144

*Primary Examiner*—Brian K. Young
*Attorney, Agent, or Firm*—Christie, Parker & Hale, LLP

[57] ABSTRACT

An encoding control device includes a voltage provider providing different voltage levels at different instances, a data control device electrically connected to the voltage provider and outputting data respectively corresponding to the voltage levels, and an encoding device electrically connected to the data control device for encoding according to the data. The present encoding control device effectively reduces the pin number of an IC package.

8 Claims, 2 Drawing Sheets

5,654,712

ENCODING CONTROL DEVICE

FIELD OF THE INVENTION

The present invention is related to a control device, and more particularly to an encoding control device.

BACKGROUND OF THE INVENTION

An encoding control device of the prior art as shown in FIG. 1 includes a data input device 1 (usually a keyboard) and an encoding control unit 2 which has a data control device 21 and an encoding device 22. The encoding control unit 2 can be implemented in a single IC with an output pin (O/P), positive and negative power source pin $V_{DD}$, $V_{ss}$, and N data receiving pins pin1~PinN. The prior-art encoding control device works in the following way: in response to a press/release state of the keyboard 1, the control device 21 sends out numerical data to the encoding device 22 which accordingly executes a control action corresponding to the numerical data received.

Generally, an encoding control device has to receive a number of numerical data D1, ..., DN to achieve diverse control effects, so the data control device 21 needs a corresponding number of pins (Pin1~PinN) for controlling data D1~DN which thus cannot cope with encoding control device of the current trend for minimizing the number of IC pins.

SUMMARY OF THE INVENTION

An object of the present invention is to provide an encoding control device for minimizing the pin number of an IC package by means of identifying numerical data by different voltage levels.

The present invention is an encoding control device including a voltage provider providing different voltage levels at different instances, a data control device electrically connected to the voltage provider and outputting data respectively corresponding to the voltage levels, and an encoding device electrically connected to the data control device for encoding according to the data.

The voltage provider may include a voltage regulator for changing the voltage levels for the encoding control device, and a voltage detecting device electrically connected to the voltage regulator to detect the voltage levels.

The voltage detecting device, the data control device, and the encoding device can be made in one IC.

The IC can be packaged to bear only three pins to complete data control.

The data control device can be a numerical data control device and the data is a numerical data.

The voltage regulator may include a plurality of resistors and a plurality of switches respectively connected to the resistors.

Alternatively, the voltage regulator may include a plurality of Zener diodes and a plurality of switches respectively connected to the Zener diodes.

The present invention may best be understood through the following description with reference to the accompanying drawings.

DETAILED DESCRIPTION OF THE PREFERRED EMBODIMENT

The present invention will now be described more specifically with reference to the following embodiments. It is to be noted that the following descriptions of preferred embodiments of this invention are presented herein for purposes of illustration and description only; it is not intended to be exhaustive or to be limited to the precise form disclosed.

Figure 1:
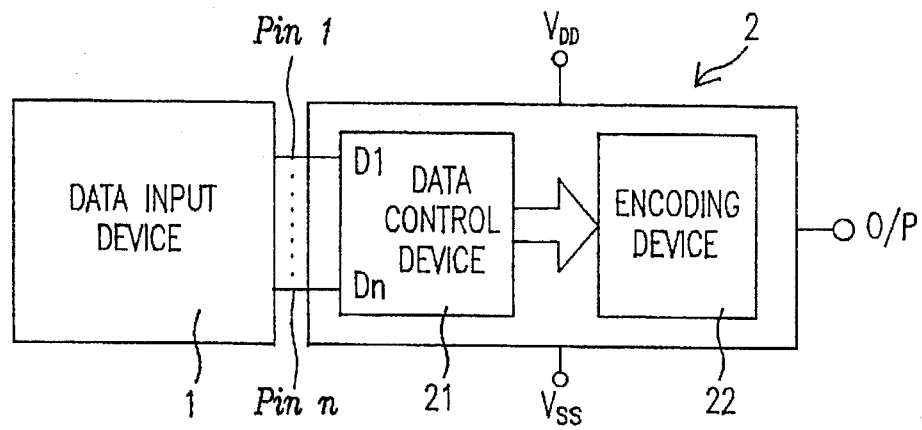
FIG. 1 is a schematic view of an encoding control device in the prior art.
Figure 2:
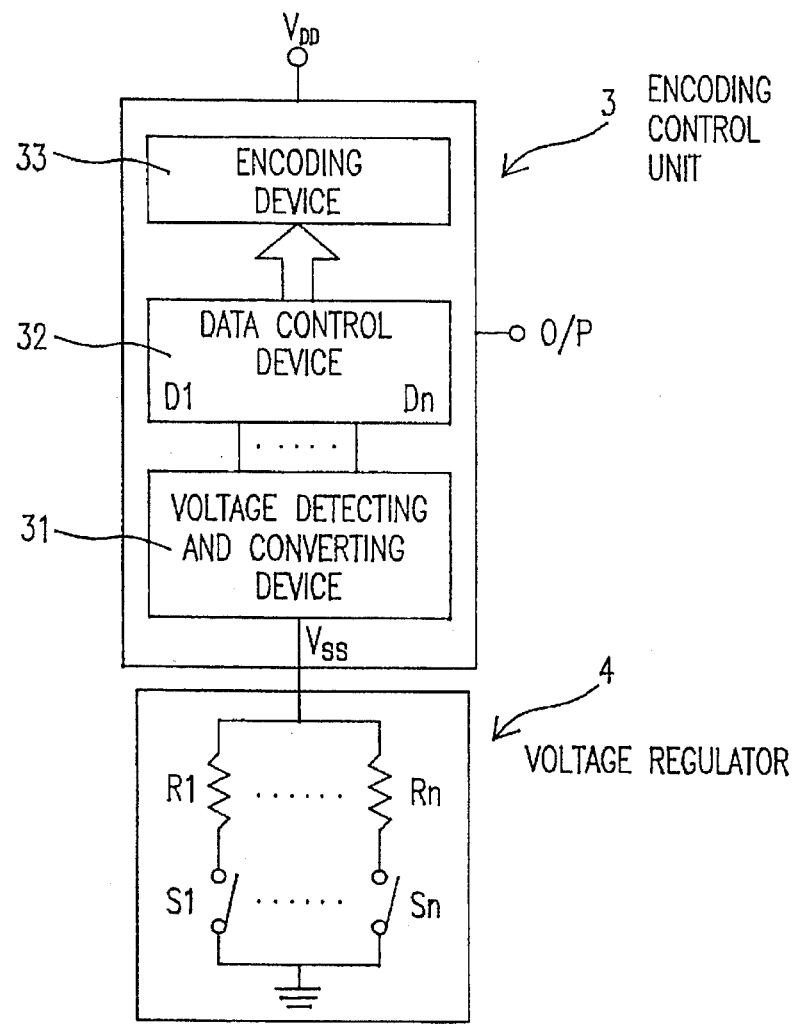
FIGS. 2 and 3 are schematic block diagrams of a preferred embodiment of an encoding control device according to the present invention.

As best seen in FIG. 2, an encoding control device according to the present invention includes a voltage provider, a data control device 32, and an encoding device 33, wherein the voltage provider further includes a voltage regulator 4 and a voltage detecting device 31. Further, the voltage detecting device 31, the data control device 32, and the encoding device 33 are made in one single IC which is designed to function as an encoding control unit 3. In a preferred embodiment, the voltage regulator 4 includes N resistors R1~RN and N switches S1~SN, and the encoding control unit 3 including output pin (O/P), positive power source pin $V_{DD}$, and negative power source pin $V_{ss}$, can be made in one IC.

The voltage regulator 4 can be electrically connected to pin $V_{ss}$ on the encoding control unit 3 for changing the voltage levels to provide a power source for the encoding control unit 3. By changing the on/off state of switches S1–SN, N voltage levels monitored by the voltage detecting device 31 are generated as the power source for the encoding control unit 3. Based on the detected voltages, the data control device 32 outputs numerical data accordingly. For instance, assuming that D1 is a numerical data defined to represent that the voltage level is 9 V, D2 is a numerical data defined to represent that the voltage level is 7 V, ... so on and so forth, so long as $V_{DD}-V_{ss}$=9 V, D1 will be outputted; when $V_{DD}-V_{ss}$=7 V, D2 will be outputted, ... etc. In such a way, the present encoding control device no longer requires data receiving pins for data control. Regarding the function of the encoding control unit 3, it is not different from the prior art.

Hence, the only three pins needed for achieving a plurality of data control in the present encoding control unit 3 are an output pin (O/P), a pin $V_{DD}$, and a pin $V_{ss}$ which reduces the number of pins required to the minimum. Another advantage of controlling data by means of voltage level detecting is that the encoding control unit can be deenergized (power-off).

Figure 3:
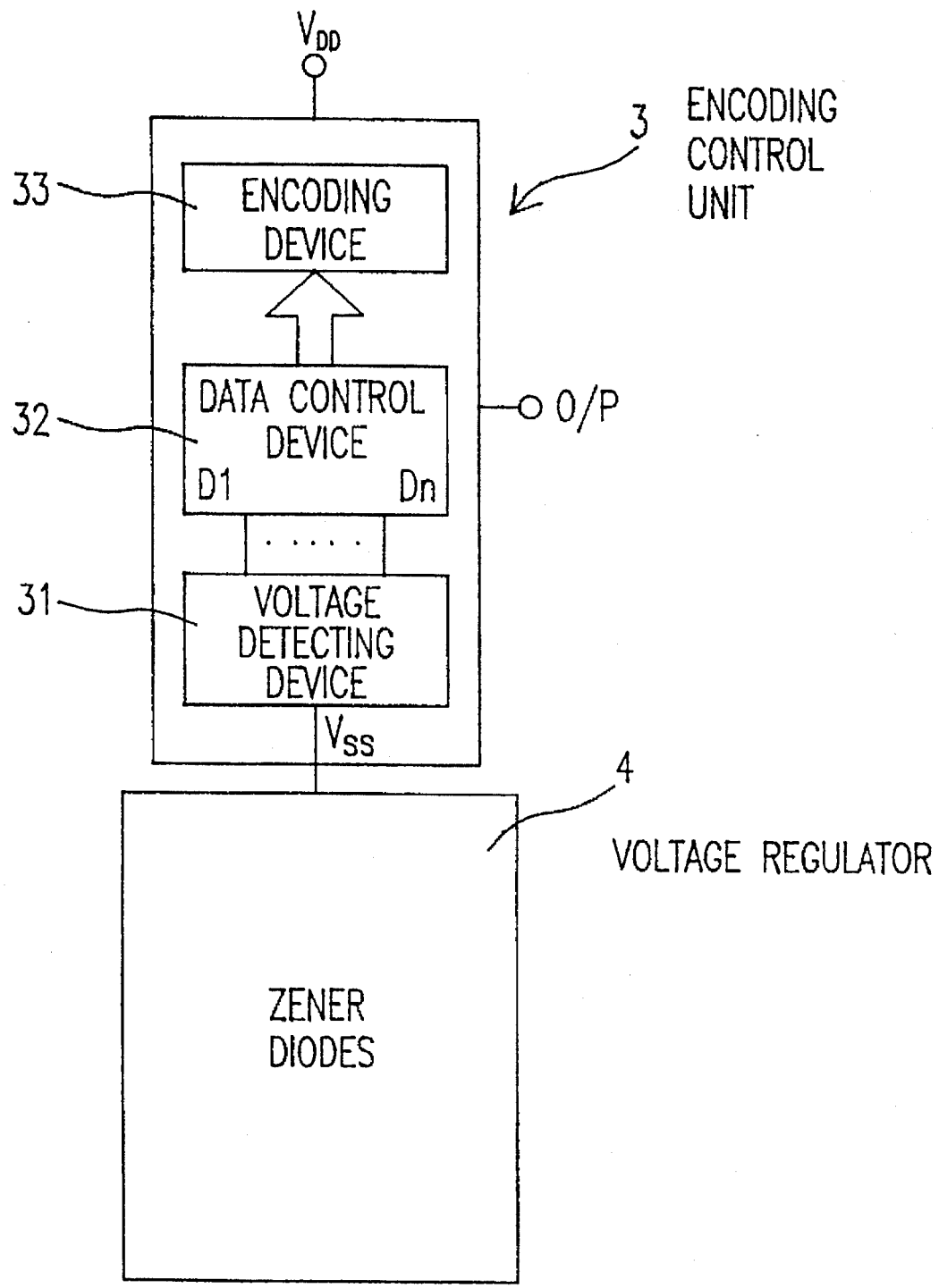

Additionally, there are certainly other ways to implement a voltage regulator 4 in addition to that already shown in FIG. 2. For example, resistors R1~RN can be replaced by Zener diodes (FIG. 3).

While the invention has been described in terms of what are presently considered to be the most practical and preferred embodiments, it is to be understood that the invention need not a limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An encoding control device for encoding input data from a data input device, comprising:

a voltage regulator for providing a specific voltage level according to said input data;

a voltage detecting and converting device having only one pin connected to said voltage regulator for detecting said specific voltage level and generating a specific numerical data in response to said specific voltage level;

a data control device electrically connected to said voltage detecting and converting device for outputting data corresponding to said numerical data; and an encoding device electrically connected to said data control device for encoding said data and outputting an encoded data, wherein said voltage detecting and converting device, said data control device, and said encoding device are integrated in an integrated circuit.

2. An encoding control device according to claim 1 wherein said data control device is a numerical data control device and said data is a numerical data.

3. An encoding control device as claimed in claim 1 wherein said voltage regulator comprises a plurality of resistors and a plurality of switches respectively connected to said resistors.

4. An encoding control device as claimed in claim 1 wherein said voltage regulator comprises a plurality of Zener diodes and a plurality of switches respectively connected to said Zener diodes.

5. An encoding control device according to claim 1 wherein said one pin is a negative power source pin of said integrated circuit.

6. An encoding control device according to claim 1 wherein said integrated circuit further includes a positive power source pin.

7. An encoding control device according to claim 1 wherein said integrated circuit further includes an output pin for outputting said encoded data.

8. An encoding control device according to claim 1 wherein said data input device is a keyboard.

* * * * *